United States Patent
Moussalli et al.

(10) Patent No.: US 9,449,134 B1
(45) Date of Patent: Sep. 20, 2016

(54) DYNAMICALLY RECONFIGURABLE LOGIC CIRCUITS USING NATIVE FIELD-PROGRAMMABLE GATE ARRAY PRIMITIVES

(71) Applicant: International Business Machines Corporation, Armonk, NY (US)

(72) Inventors: Roger Moussalli, Peekskill, NY (US); Sameh Asaad, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/751,048

(22) Filed: Jun. 25, 2015

(51) Int. Cl.
*G06F 17/50* (2006.01)
*H03K 19/177* (2006.01)

(52) U.S. Cl.
CPC ......... *G06F 17/5054* (2013.01); *G06F 17/505* (2013.01); *H03K 19/17728* (2013.01)

(58) Field of Classification Search
CPC .................... H03K 19/17728; G06F 17/5054; G06F 17/505
USPC ............................... 326/37–39; 716/116–117
See application file for complete search history.

(56) References Cited

U.S. PATENT DOCUMENTS

| | | | |
|---|---|---|---|
| 6,255,849 B1 | 7/2001 | Mohan | |
| 7,954,114 B2 | 5/2011 | Chamberlain et al. | |
| 8,069,102 B2 | 11/2011 | Indeck et al. | |
| 8,725,671 B2 | 5/2014 | Yamagaki | |
| 2013/0305199 A1 | 11/2013 | He et al. | |
| 2014/0165021 A1* | 6/2014 | Pattichis | G06F 17/5054 716/133 |
| 2014/0223034 A1* | 8/2014 | Xia | G06F 17/5054 710/8 |

OTHER PUBLICATIONS

A. Tiwari et al., "Saving power by mapping finite-state machines into embedded memory blocks in FPGAs," Proceedings of the conference on Design, Automation and Test in Europe—vol. 2, IEEE Computer Society, 2004, pp. 1-6.

(Continued)

*Primary Examiner* — Stacy Whitmore
(74) *Attorney, Agent, or Firm* — Vazken Alexanian; Otterstedt, Ellenbogen & Kammer, LLP (57) ABSTRACT

A method for dynamically reconfiguring logic circuits on an FPGA includes the steps of: classifying a general function into sets of static functions and modal functions to be implemented on the FPGA; for each of the modal functions, generating a list of one-active actions; devising a circuit topology including at least a subset of look-up tables (LUTs) such that any one of the modal functions can be implemented at a time on the devised circuit topology; for each modal function, associating the devised circuit topology with a controller adapted to load a LUT configuration corresponding to a prescribed one of the one-active actions; implementing a single fixed circuit on the FPGA including devised circuit topologies for each of the modal functions; and updating contents of LUTs corresponding to the LUT configuration in the devised circuit topology when a change in modal function to be implemented on the FPGA is required.

20 Claims, 8 Drawing Sheets

(56) References Cited

OTHER PUBLICATIONS

J.W. Lockwood et al., "Reprogrammable Network Packet Processing on the Field Programmable Port Extender (FPX)," Proceedings of the 2001 ACM/SIGDA Ninth International Symposium on Field programmable Gate Arrays, ACM, 2001, pp. 87-93.

J. Divyasree et al., "Dynamically Reconfigurable Regular Expression Matching Architecture," Application-Specific Systems, Architectures and Processors, 2008, ASAP 2008, International Conference on, IEEE, 2008, pp. 120-125.

* cited by examiner

DYNAMICALLY RECONFIGURABLE LOGIC CIRCUITS USING NATIVE FIELD-PROGRAMMABLE GATE ARRAY PRIMITIVES

FIELD

The present invention relates generally to the electrical, electronic and computer arts, and, more particularly, to circuit implementations using field-programmable gate arrays.

BACKGROUND

Field programmable gate arrays (FPGAs) are composed of a finite number of predefined resources with programmable interconnects. These programmable interconnects implement user-defined logic circuitry on the FPGA. Logic circuit designers write code in a hardware description language (HDL) which describes how logic blocks are wired together on the FPGA to implement a desired circuit. The code is passed through proprietary compilation tools that translate the desired circuit into FPGA configuration bits. These FPGA configuration bits are primarily in the form of look-up table (LUT) contents and switch matrix configurations which are customized for the desired circuit.

The process of compiling HDL code into FPGA configuration bits, known as synthesis/place-and-route (PAR), can require up to several hours and even days for completion, depending on the size and complexity of the circuit to be implemented. In order to apply updates to an FPGA-mapped circuit (e.g., implemented data processing functions), the circuit designer first updates the HDL code, then configuration bits are re-generated, and finally the FPGA is re-programmed. Although certain FPGA vendors provide support for reconfiguring user-defined regions of the FPGA, this partial reconfiguration process is cumbersome, resource wasteful, and synthesis (i.e., compilation) is still required, albeit for a smaller subset of the FPGA. Partial reconfiguration also imposes restrictions on the placement of user functions, and is thus undesirable.

SUMMARY

Principles of the invention, in accordance with one or more embodiments thereof, provide techniques for dynamically reconfiguring a logic circuit implemented on a field-programmable gate array (FPGA) using FPGA primitives, without the need for synthesis/place-and-route.

In one aspect, an exemplary method for dynamically reconfiguring logic circuits on an FPGA includes the steps of: classifying a general function into sets of static functions and modal functions to be implemented on the FPGA; for each of the modal functions, generating a list of one-active actions; devising a circuit topology including at least a subset of look-up tables (LUTs) such that any one of the modal functions can be implemented at a time on the devised circuit topology; for each modal function, associating the devised circuit topology with a controller adapted to load a LUT configuration corresponding to a prescribed one of the one-active actions; implementing a single fixed circuit on the FPGA including devised circuit topologies for each of the modal functions; and updating contents of LUTs corresponding to the LUT configuration in the devised circuit topology when a change in modal function to be implemented on the FPGA is required.

In another aspect, an exemplary apparatus for dynamically reconfiguring logic circuits on an FPGA using native FPGA primitives without the need for synthesis/place-and-route includes a memory, at least one processor coupled to the memory, and a non-transitory persistent storage medium. The storage medium contains instructions which, when loaded into the memory, configure the processor: to classify a given general function into a set of one or more static functions and a set of one or more modal functions to be implemented on the FPGA; to generate, for each of the one or more modal functions, a list of one-active actions; to devise a circuit topology including at least a subset of the native FPGA primitives such that any one of the one or more modal functions can be implemented at a time on the devised circuit topology; to associate, for each modal function, the devised circuit topology with a controller adapted to load a native FPGA primitive configuration corresponding to a prescribed one of the one-active actions; to implement a single fixed circuit on the FPGA including devised circuit topologies for each of the modal functions; and to update contents of native FPGA primitives corresponding to the native FPGA primitive configuration in the devised circuit topology when a change in modal function to be implemented on the FPGA is required. In one or more embodiments, at least a subset of the native FPGA primitives includes LUTs, the contents of which are modified as a function of the modal function(s) to be implemented.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments may provide one or more of the following advantages:

resource utilization in an FPGA comparable to the synthesis/place-and-route approach (resource utilization customized for the function at hand); and     FPGA reconfiguration time comparable to implementing circuitry for every possible function of interest and a configurable multiplexer to select which of the function circuitry to use at any given time (no synthesis/place-and-route required for updates).

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative methods and apparatus for implementing logic functions on a field-programmable gate array (FPGA) by fixing the FPGA circuit topology at runtime and then modifying look-up table (LUT) contents on the fly when a different logic function implementation on the FPGA is required. It is to be appreciated, however, that the invention is not limited to the specific apparatus and/or methods illustratively shown and described herein. Rather, aspects of the present disclosure relate more broadly to techniques for dynamically reconfiguring a logic circuit implemented on an FPGA using FPGA primitives, without the need for synthesis/place-and-route. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1:
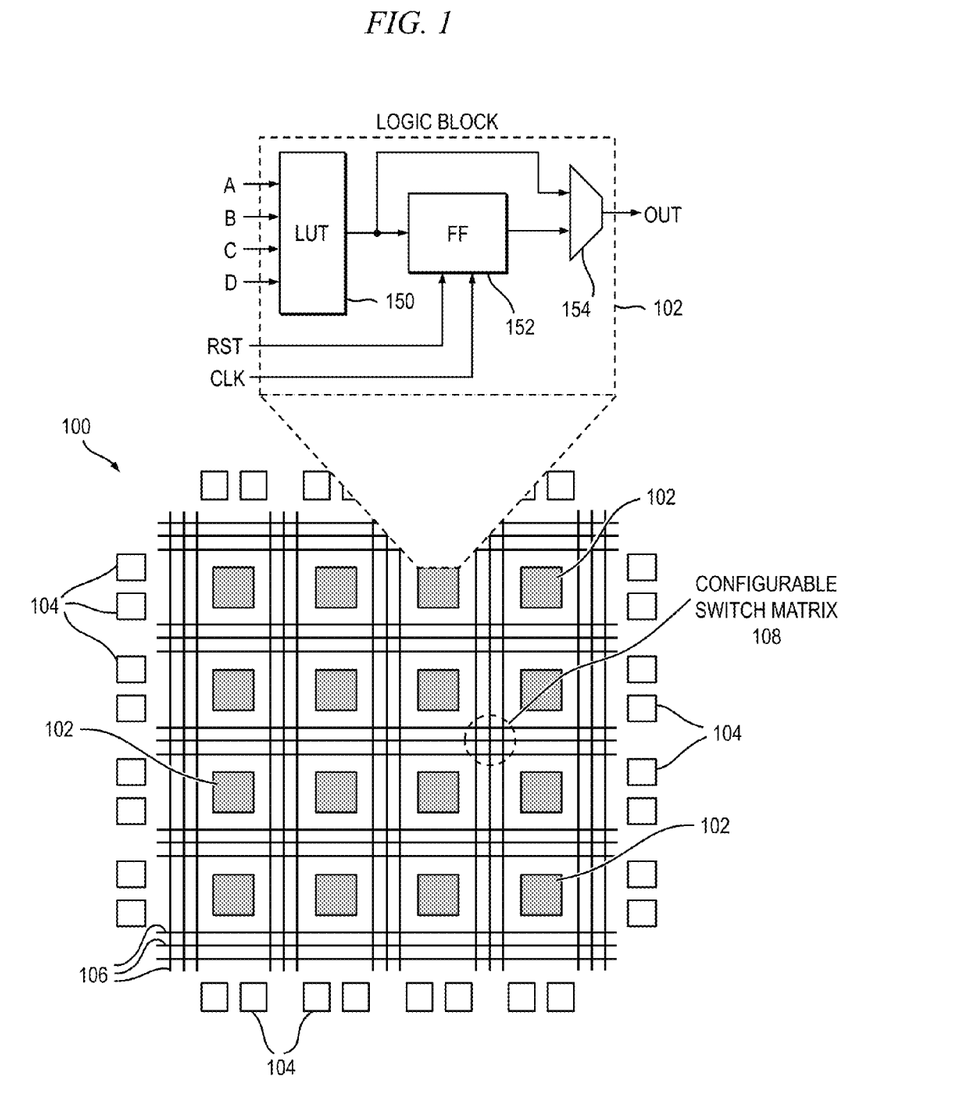
FIG. 1 is a block diagram depicting at least a portion of an exemplary FPGA module which can be modified to implement aspects of the invention.

FIG. 1 is a block diagram depicting at least a portion of an exemplary FPGA module 100 which can be modified to implement aspects of the invention. The FPGA module 100 includes a plurality of logic blocks 102, a plurality of input/output (I/O) blocks 104, and programmable routing 106 operatively coupled with the logic blocks and I/O blocks. The programmable routing 106 is often organized as rows and columns of wiring, with a configurable switch matrix 108 included at each (or at least a subset of) row and column intersection. The programmable routing 106 is used to interconnect select logic blocks 102 and I/O blocks 104 according to a desired circuit topology to be implemented on the FPGA. I/O blocks 104 provide an interface between the various logic blocks 102 on the FPGA and circuitry external to the FPGA. An I/O block 104 may include, for example, such circuits as I/O buffers, voltage level converters, analog-to-digital converters (ADCs), digital-to-analog converters (DACs), and the like.

Each of the logic blocks 102 in the exemplary embodiment shown in FIG. 1 preferably comprises logic resources that can perform logic functions. The logic resources are often grouped in slices (or another arrangement) to create configurable logic blocks. A slice includes a prescribed number of LUTs 150, flip-flops (FFs) 152 and multiplexers 154. A LUT 150 is an FPGA primitive comprising a collection of logic gates hard-wired on the FPGA that store a predefined list of outputs for every combination of inputs and provides a fast means of retrieving the output as a logic operation. In the illustrative logic block 102, the LUT 150 is configured to receive four inputs (A, B, C, D) and generates a single output. A flip-flop is a circuit capable of two stable states and represents a single bit. In this embodiment, flip-flop 152 is configured to receive the output generated by LUT 150 and receives two control signals; namely, a clock signal (CLK) and a reset signal (RST). A multiplexer 154 is a circuit that selects between two or more inputs (e.g., an output of LUT 150 or an output of FF 152), via one or more control inputs (not explicitly shown, but implied), and generates, as an output thereof, the selected input. It is to be appreciated that embodiments of the invention are not limited to any specific circuitry and/or connection arrangement of the LUTs 150.

As previously stated, for FPGA applications involving circuit reconfiguration, the time required for compiling new HDL code, as part of the synthesis/place-and-route (PAR) process, can be prohibitive. The need for frequent (faster than compilation) reconfiguration can arise in various scenarios. For example, consider a pattern matching application requiring frequent changes in pattern matching circuitry based on the pattern of interest. One conventional solution is to implement one pattern matching engine (i.e., circuitry)

for every possible pattern of interest; thus for P patterns, there would be P pattern matching engines utilized. All pattern matching engines would be placed on the FPGA as a single circuit. The pattern matching engines would be complemented with a flexible multiplexer, which is one whose select bits can be updated through some user-controllable mechanism. Examples of a flexible multiplexer would include a multiplexer controlled by a finite state machine (FSM), or a multiplexer controlled by bits stored in flip-flops or a register.

While the aforementioned approach removes the need for lengthy synthesis/place-and-route, there are many drawbacks including, for example, high resource utilization required to implement all P solutions (even though only one of the P engines is used at any given time). Moreover, multiple scenarios can arise wherein the state explosion in the number of patterns P can lead to too many circuits that cannot reside on the same FPGA at once.

Aspects of the present disclosure beneficially address the problem of updating FPGA functionality without requiring synthesis/place-and-route for updates, and with minimal impact on resource utilization to the user logic in the FPGA. Starting from a set of multiple functions, one or more embodiments of the invention generates a common topology of look-up tables (LUTs) to evaluate any of the functions at a given time. The initial set of functions is not restricted to pattern matching circuits (e.g., regular expression), but rather can be any logic function. As such, there is no restriction on the architecture of the implemented common topology.

More particularly, rather than deploying a set of one-active functions (meaning one function is used at a time while all other functions are inactive) simultaneously on the FPGA, only the active function is deployed on the FPGA, according to one or more embodiments, in such a manner that synthesis/place-and-route is not required for updates. Accordingly, one or more embodiments of the invention may provide at least one or more of the following advantages over conventional approaches:

resource utilization comparable to the synthesis/place-and-route approach (resource utilization customized for the function at hand); and reconfiguration time comparable to the configurable multiplexer (no synthesis/place-and-route required for updates).

In order to achieve one or more of the noted benefits, circuits are designed at the LUT level, according to one or more embodiments. An observation is that, once synthesized, circuits are implemented on the FPGA in the form of connected LUTs (e.g., selected using configuration bits of switch matrices) and LUT contents (LUT configuration bits). LUT connections cannot be modified after synthesis/place-and-route, without recompilation; and thus recompilation should be avoided. However, LUT contents can be modified, a feature enabled by careful circuit design. Modifying only the LUT contents, and not their connections, results in modifying the implemented function. Therefore, when a circuit topology is set by the designer so as to support all required functions, synthesis/place-and-route is required only once to initially configure LUT connections on the FPGA. After the initial synthesis/place-and-route, whenever the function needs to be modified, only the LUT contents are updated, a step that does not require circuit reconfiguration via synthesis/place-and-route (i.e., HDL recompilation).

One trade-off to the approach according to one or more embodiments of the invention is that pre-mediated LUT connections may limit the number of possible unique functions that can be mapped to the LUTs. Nonetheless, this trade-off is not of any significant concern, as it is the task of the designer to set the LUT connections so as to include all functions that may need to be implemented on the FPGA. Furthermore, the number of unique functions that can be mapped is very large (exponential in the number of bits in all available LUTs). Benefits achievable in accordance with aspects of the invention, including the efficient utilization of resources without the exorbitant time for synthesis/place-and-route otherwise required in performing updates to the FPGA, far outweigh any minor restrictions in the number of possible unique functions that can be mapped to the LUTs.

One or more embodiments of the invention provide an apparatus and methodology by which a set of one-active generic functions are implemented on an FPGA in a hardware resource-efficient manner, and where context (i.e., the function(s) of interest at a given point in time) can be dynamically reconfigured at runtime in a time-efficient manner. Here, the term "runtime" is intended to mean while the application is running (i.e., without interrupting the application), and also means without having to take down (i.e., turn off) the FPGA, so that the FPGA stays online and unaffected functions and connections to the host proceed with normal execution. It is to be appreciated that the initial set of functions is not restricted to a given type or types of functions (e.g., regular expression pattern matching functions), but rather can be any logic function. Consequently, there is no restriction on the architecture of the common topology implemented on the FPGA. After the initial set of functions has been established and a LUT circuit topology has been synthesized, the set of functions would be restricted to those that can be implemented using the fixed LUT topology on the FPGA.

Figure 2A:
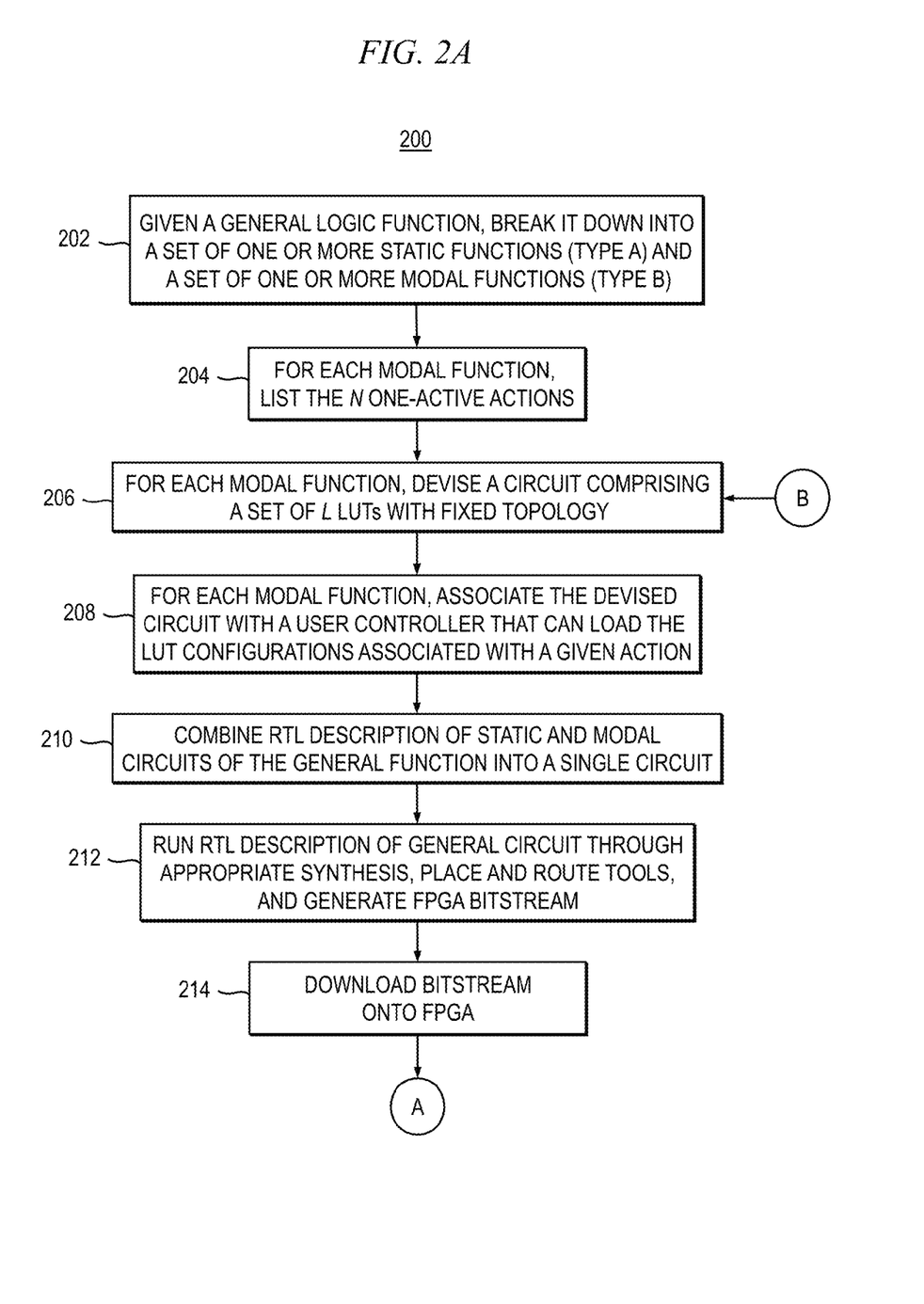
FIGS. 2A-2B illustrate a flow diagram depicting at least a portion of an exemplary method for implementing dynamically reconfigurable logic circuits using native FPGA primitives, according to an embodiment of the invention.
Figure 2B:
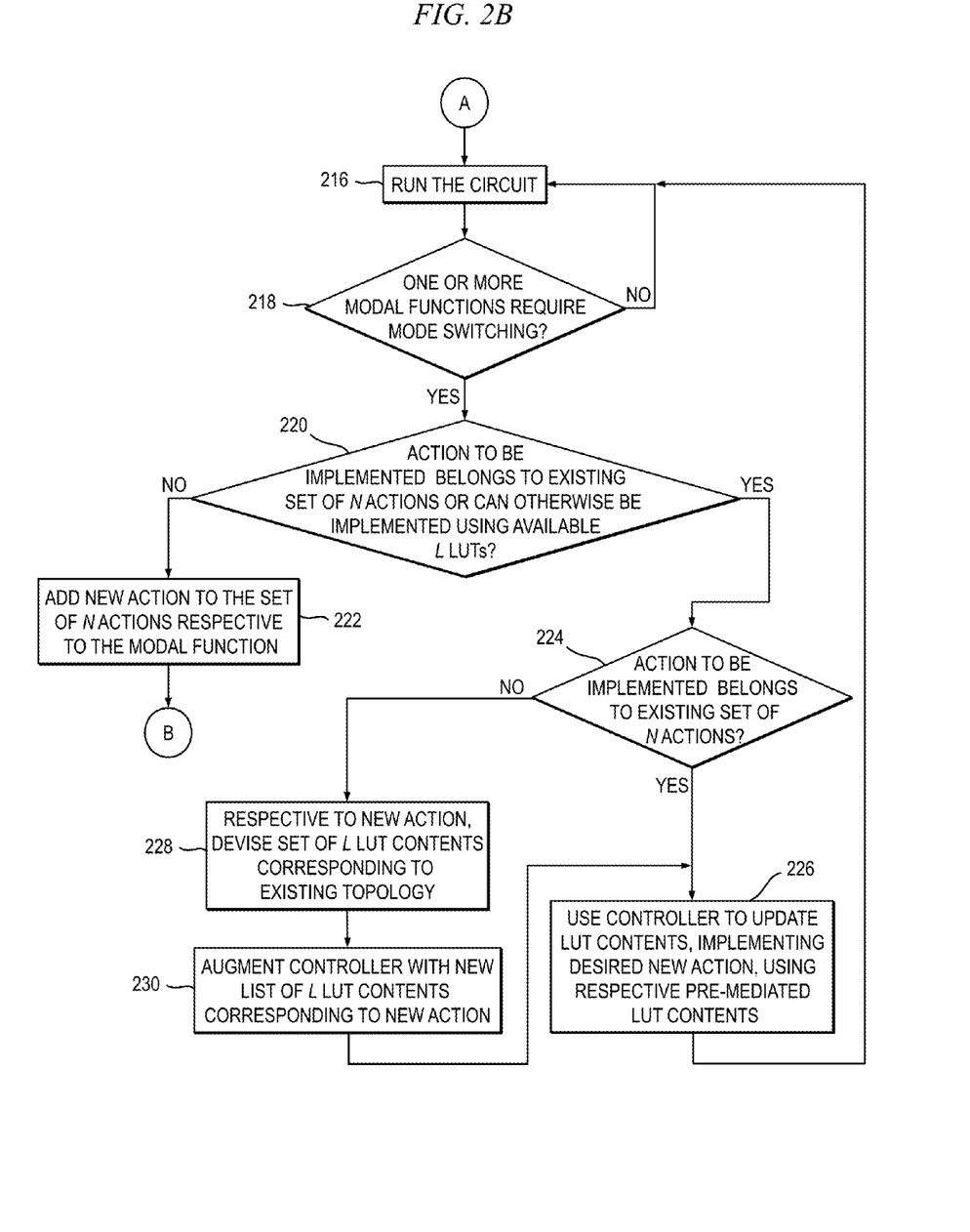

FIGS. 2A-2B illustrate a flow diagram depicting at least a portion of an exemplary method 200 for implementing dynamically reconfigurable logic circuits using native FPGA primitives, according to an embodiment of the invention. Starting from a set of multiple, one-active/modal functions, one or more embodiments generate a common topology of LUTs to evaluate any of the functions of interest at a given time. With reference to FIG. 2A, the method 200 starts in step 202 by classifying (i.e., breaking down or dividing) a given general function into a set of one or more static functions (type A) and a set of one or more modal functions (type B) implemented on the FPGA. Static functions can be defined broadly as functions that do not change during execution. Modal functions, on the other hand, can be defined broadly as functions that implement one action at a time; thus, for a modal function, where given a set of N actions, only one action is active at a time during execution.

In step 204, for each modal function, a corresponding list of N one-active actions is generated. For each modal function, step 206 devises a circuit comprising a set of L LUTs with fixed topology, such that any one of the N actions can be implemented at a time on the devised circuit. Each of the N actions is associated with the L LUT configurations corresponding to the action to be implemented. The set of N LUT configurations (for each of the L LUTs) can be generated manually, or through an automated tool.

In step 208, for each modal function, the devised circuit is associated with a user controller that can load, at runtime, the LUT configurations associated with a given action. The register-transfer level (RTL) description of the static and modal circuits (with controllers) of the general function are combined into a single circuit in step 210. In step 212, the RTL description of the general circuit is run through appropriate synthesis, place and route tools to thereby generate a corresponding FPGA bitstream. This FPGA bitstream is then downloaded onto the FPGA in step 214.

With reference now to FIG. 2B, the circuit is run in step 216. In step 218, a determination is made as to whether one or more of modal functions require mode switching. If no mode switching is required to any of the modal functions, the method 200 returns to step 216 which continues to run the circuit. If, however, it is determined in step 218 that for one or more of the modal functions the mode needs to be switched (i.e., the active action is to be changed), a determination is made, in step 220, as to whether the action to be implemented belongs to the existing set of N actions or can otherwise be implemented using the available L LUTs. When the action to be implemented does not belong to the existing set of N actions and cannot be implemented using the available L LUTs and fixed topology belonging to the respective modal function, the new action is added to the existing set of N actions respective to the modal function in step 222, and the method 200 returns to step 206 (FIG. 2A).

Alternatively, when the action to be implemented belongs to the existing set of N actions or can otherwise be implemented using the available L LUTs and fixed topology belonging to the respective modal function, a determination is made in step 224 regarding whether the action to be implemented belongs to the existing set of N actions. When the action to be implemented belongs to the existing set of N actions, the controller is used to update the L LUT contents, implementing the desired new action, using the respective pre-mediated LUT contents in step 226. The circuit is then run in step 216, and the method 200 continues as previously described.

When it is determined in step 224 that the action to be implemented does not belong to the existing set of N actions, respective to the new action, a set of L LUT contents corresponding to the existing topology is devised in step 226. When loaded with these contents, the L LUTs would be configured to implement the new desired action. Then, in step 228, the controller is augmented with the new set of L LUT contents corresponding to the new action. The method continues to step 226, which updates the L LUT contents using the controller.

Figure 3:
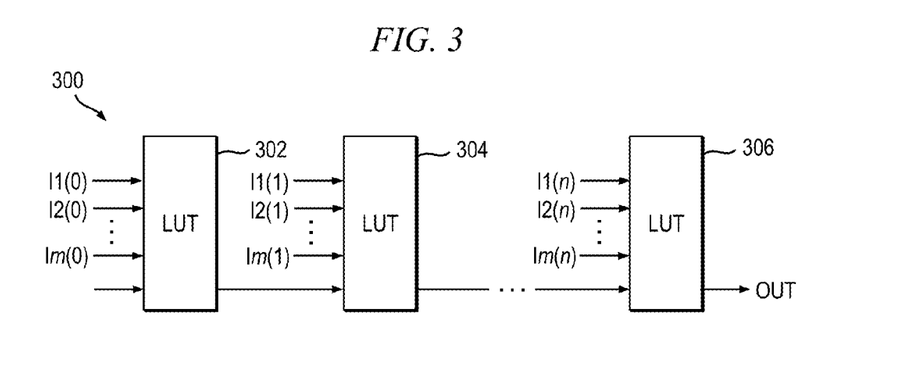
FIG. 3 is a block diagram conceptually depicting at least a portion of a circuit template for implementing a generic logic circuit which may be useful in conjunction with one or more embodiments of the invention.

As previously explained, in order to achieve the characteristics and benefits noted above, circuits are to be designed at the LUT level. LUTs represent one the lowest-level FPGA primitives. Thus, once synthesized, desired circuits will be realized on the FPGA in the form of connected LUTs and LUT contents. FIG. 3 is a block diagram depicting at least a portion of a circuit template 300 for implementing a generic logic circuit. The circuit template 300 includes n+1 LUTs, 302, 304 through 306, where n is an integer. An output of each LUT is supplied as an input to an adjacent LUT, with the output of the last (downstream) LUT 306 in the chain forming a primary output, OUT, of the circuit template 300. Each of the LUTs 302, 304, 306, is configured to receive m primary inputs, Ij(1) through Ij(m), where j is an index number representing the particular LUT in the chain and m is an integer representing the number of primary inputs.

Figure 4A:
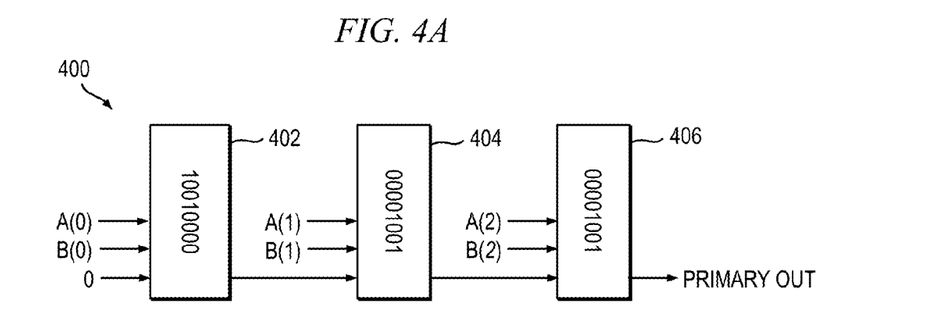
FIGS. 4A-4B conceptually depict at least a portion of exemplary FPGA connections and look-up table (LUT) contents for implementing two different illustrative logic functions, according to embodiments of the invention.
Figure 4B:
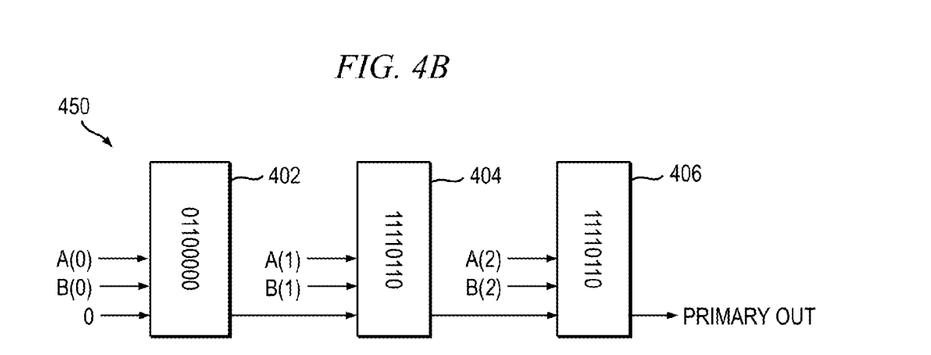

By way of example only and without limitation, FIGS. 4A-4B conceptually depict at least a portion of exemplary FPGA connections and LUT contents for implementing two different illustrative logic functions, according to embodiments of the invention. Specifically, FIG. 4A shows an exemplary FPGA circuit configuration 400 for implementing the function a==b using three-input LUTs, where each of a and b are three-bit signals. Since a and b are three-bit signals, three LUTs, 402, 404 and 406, are used. The LUTs are connected such that an output of the first LUT 402 is supplied as an input to the second LUT 404, an output of the second LUT 404 is supplied as an input to the third LUT 406, and an output of the third LUT 406 forms a primary output of the circuit. Bit A(0) supplied as a primary input to LUT 402, bit A(1) supplied as a primary input to LUT 404, and bit A(2) supplied as a primary input to LUT 406, collectively, represent the three-bit signal a. Likewise, bit B(0) supplied as a primary input to LUT 402, bit B(1) supplied as a primary input to LUT 404, and bit B(2) supplied as a primary input to LUT 406, collectively, represent the three-bit signal b.

Synthesis handles translating a circuit into LUT contents, as well as LUT connections (i.e., the circuit topology), and will also deal with constraining the LUTs to physical LUT mappings (the LUTs shown in FIG. 4A can be placed on any physical FPGA LUT, given real estate considerations and available routing resources).

Notably, it can be demonstrated that the same circuit topology depicted in FIG. 4A can be used to implement other logical functions. For example, with reference to FIG. 4B, an exemplary FPGA circuit configuration 450 is shown for implementing the function a!=b, where "!=" is a "not equal" operator, according to an embodiment of the invention. Circuit configuration 450 shares the same topology as the circuit configuration 400 shown in FIG. 4A, except that the contents of the LUTs 402, 404 and 406 have been modified. The same holds true for implementing the functions a<b, a<=b (less than or equal to), a>b, a>=b (greater than or equal to), and various other functions that can be implemented on the same circuit topology. By merely changing the contents of the respective LUTs, different functions can be implemented on the same topology, without requiring synthesis/place-and-route.

FPGA vendors typically give designers access to the LUT primitives. The designer is therefore able to describe in HDL a LUT topology for the portion of the logic that is to be reprogrammed. The topology and surrounding circuitry is synthesized once and mapped to the FPGA. Different initial sets of modal functions may result in varying respective topologies. Whenever a new function is to be implemented on the FPGA, only the LUT configuration bits will be modified.

Figure 5:
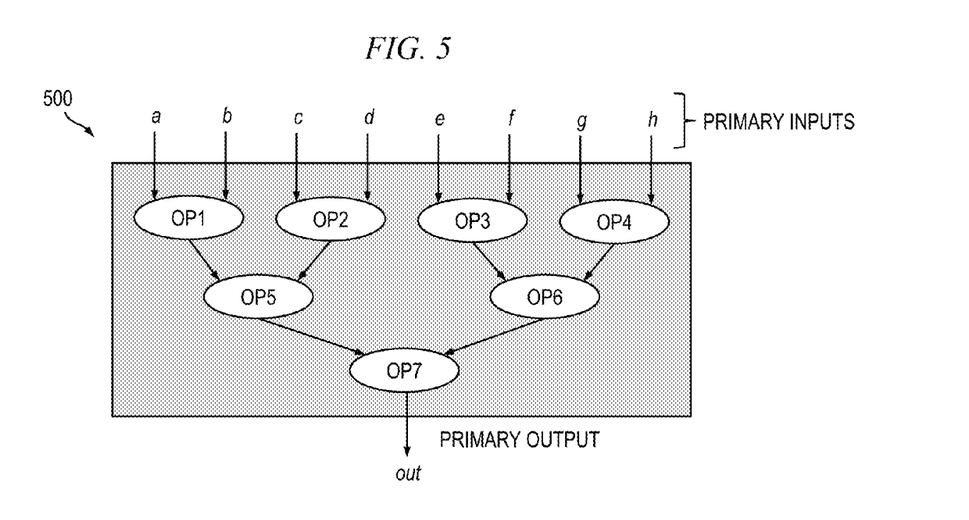
FIG. 5 is a block diagram conceptually depicting at least a portion of an exemplary tree topology which can be used to determine an initial FPGA configuration, according to an embodiment of the invention.

FIG. 5 is a block diagram conceptually depicting at least a portion of an exemplary tree topology 500 which can be used to determine an initial LUT configuration on an FPGA, according to an embodiment of the invention. In this illustrative embodiment, the tree topology 500 is configured to receive eight primary inputs, a, b, c, d, e, f, g and h, and to generate one primary output, out. The topology comprises seven operator blocks or modules, OP1, OP2, OP3, OP4, OP5, OP6 and OP7, interconnected in a hierarchical fashion as shown. Specifically, operator block OP1 is configured to receive primary inputs a and b, operator block OP2 is configured to receive primary inputs c and d, operator block OP3 is configured to receive primary inputs e and f, and operator block OP4 is configured to receive primary inputs g and h. Outputs of operator blocks OP1 and OP2 are supplied as respective inputs to operator block OP5, and outputs of operator blocks OP3 and OP4 are supplied as respective inputs to operator block OP6. Operator block OP7 is configured to receive outputs from operator blocks OP5 and OP6 and to generate the primary output. The primary output can be expressed as follows:

$$\text{out} = ((a \; OP1 \; b) OP5 (c \; OP3 \; d)) OP7 ((e \; OP3 \; f) OP6 (g \; OP4 \; h)) \tag{1}$$

Expression (1) for the primary output can be used to implement a reduction circuit, where each operator OP block can be configured to implement any of the following Boolean functions: AND, OR, XOR, NOR, etc.

Figure 6:
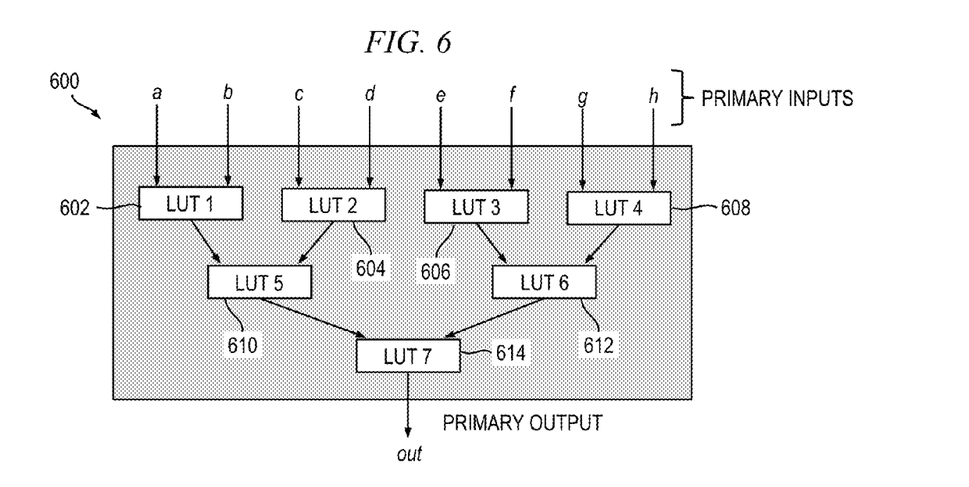
FIG. 6 is a block diagram conceptually depicting an illustrative circuit topology for implementing the exemplary tree topology shown in FIG. 5 using two-input LUTs for each operator block, according to an embodiment of the invention.

FIG. 6 is a block diagram conceptually depicting an illustrative circuit topology 600 for implementing the exemplary tree topology 500 shown in FIG. 5 using two-input LUTs, according to an embodiment of the invention. In this embodiment, each LUT implements a single operator block. More particularly, a first LUT (LUT 1) 602 implements operator block OP1, a second LUT (LUT 2) 604 implements operator block OP2, a third LUT (LUT 3) 606 implements operator block OP3, a fourth LUT (LUT 4) 608 implements operator block OP4, a fifth LUT (LUT 5) 610 implements operator block OP5, a sixth LUT (LUT 6) 612 implements operator block OP6, and a seventh LUT (LUT 7) 614 implements operator block OP7.

By way of example only and without limitation, the illustrative LUT configuration 600 shown in FIG. 6 can be used to implement the following primary output expression:

$$\text{out}=((a \text{ AND } b) \text{ AND } (c \text{ OR } d)) \text{ OR } ((e \text{ XOR } f) \text{ AND } (g \text{ OR } h)) \qquad (2)$$

Figure 7:
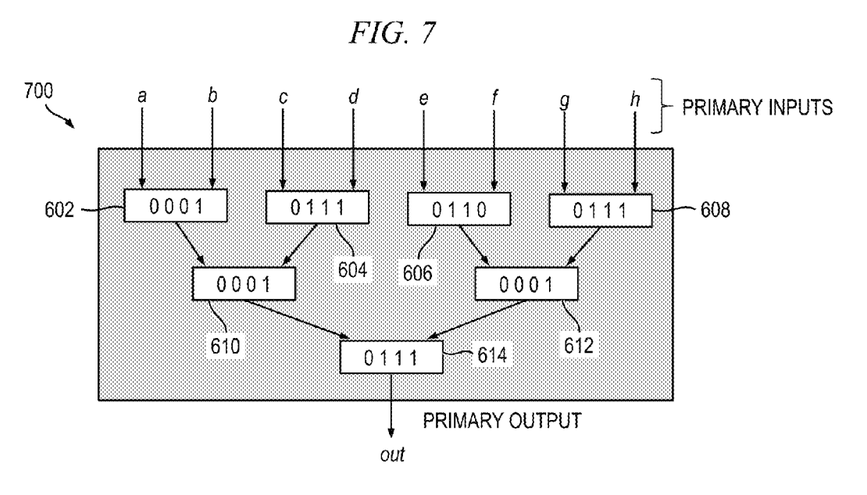
FIG. 7 is a block diagram conceptually depicting the implementation of an exemplary primary output function using the illustrative circuit topology of FIG. 6, according to an embodiment of the invention.

FIG. 7 is a block diagram conceptually depicting an illustrative circuit 700 for implementing the primary output expression (2) shown above, according to an embodiment of the invention. As apparent from FIG. 7, the circuit 700 utilizes the same topology as the circuit 600 of FIG. 6, except that the LUT contents for implementing expression (2) are indicated. Specifically, with reference to FIG. 7, LUTs 602, 610 and 612 are loaded with the contents "0001," which represents a Boolean AND operation, LUTs 604, 608 and 614 are loaded with the contents "0111," which represents a Boolean OR operation, and LUT 606 is loaded with the contents "0110," which represents a Boolean exclusive-OR (XOR) operation. Truth tables for each of the respective Boolean AND, OR and XOR functions are shown below.

| AND | | |
|---|---|---|
| a | b | out |
| 0 | 0 | 0 |
| 0 | 1 | 0 |
| 1 | 0 | 0 |
| 1 | 1 | 1 |

| OR | | |
|---|---|---|
| a | b | out |
| 0 | 0 | 0 |
| 0 | 1 | 1 |
| 1 | 0 | 1 |
| 1 | 1 | 1 |

| XOR | | |
|---|---|---|
| a | b | out |
| 0 | 0 | 0 |
| 0 | 1 | 1 |
| 1 | 0 | 1 |
| 1 | 1 | 0 |

Figure 8:
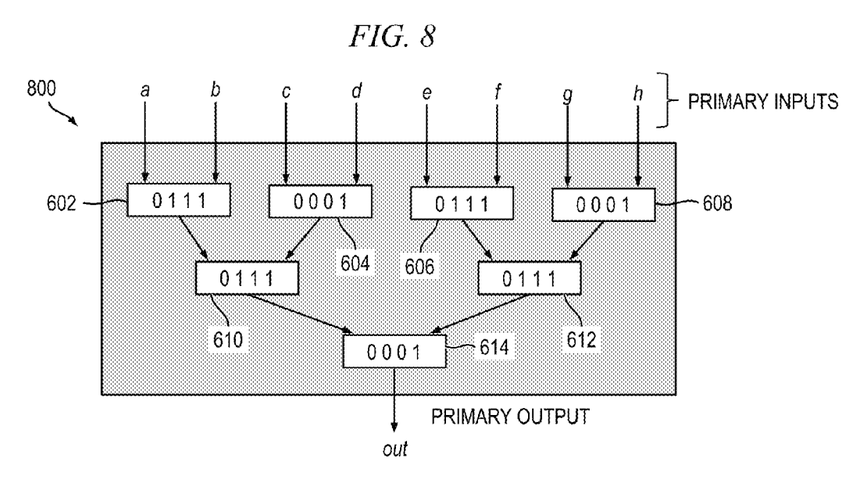
FIG. 8 is a block diagram conceptually depicting the implementation of a second exemplary primary output function using the illustrative circuit topology of FIG. 6, according to an embodiment of the invention.

The contents of LUTs in the circuit topology 700 can be modified, without changing the connection arrangement of the LUTs (and thus without the need for time-intensive synthesis/place-and-route), to implement different output functions. For example, by changing the contents of the LUTs to that shown in the illustrative circuit topology 800 shown in FIG. 8, the following primary output function can be implemented:

$$\text{out}=((a \text{ OR } b) \text{ OR } (c \text{ AND } d)) \text{ AND } ((e \text{ OR } f) \text{ OR } (g \text{ AND } h)) \qquad (3)$$

Specifically, with reference to FIG. 8, to implement the function in expression (3) above, LUTs 602, 606, 610 and 612 are loaded with the contents "0111" representing a Boolean OR operation, and LUTs 604, 608 and 614 are loaded with the contents "0001" representing a Boolean AND operation.

Figure 9:
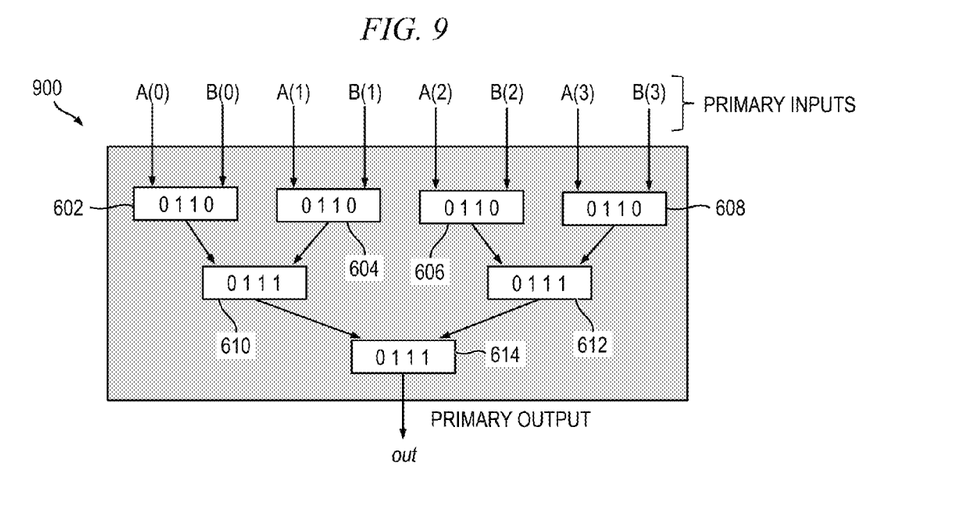
FIG. 9 is a block diagram conceptually depicting the implementation of a third exemplary primary output function using the illustrative circuit topology of FIG. 6, according to another embodiment of the invention.

Likewise, using the same circuit topology shown in FIGS. 6-8, it is also possible to implement an equal comparator function, though it is not possible to implement the greater than comparator function previously described without performing synthesis/place-and-route. Assuming that the primary inputs a, b, c, d, e, f, g and h shown in FIG. 6 represent bit positions A(0), B(0), A(1), B(1), A(2), B(2), A(3) and B(3), respectively, of two four-bit words, A and B, being compared, then the function out=(A!=B) is implemented using the LUT configuration 900 shown in FIG. 9. Specifically, LUTs 602, 604, 606 and 608 are loaded with the contents "0110" representing a Boolean XOR operation, and LUTs 610, 612 and 614 are loaded with the contents "0111" representing a Boolean OR operation.

Given L LUTs connected by a fixed circuit topology, the set of functions that can be mapped to that circuit is smaller than the set of functions that can be mapped to the L LUTs with no pre-mediated wiring. However, compared to other available approaches:

full FPGA synthesis/place-and-route allows the designer to reuse any LUTs with any connectivity, at a cost of significantly high re-programmability time (mostly due to synthesis time).

in the case of partial reconfiguration, a user can also reuse LUTs within a fixed region of the FPGA with any connectivity desired, though synthesis/place-and-route is still required.

when compared to the multiplexer-implemented mechanism, the space of functions that can be mapped to the LUT-programmable hardware approach according to embodiments of the invention is considerably higher.

Figure 10A:
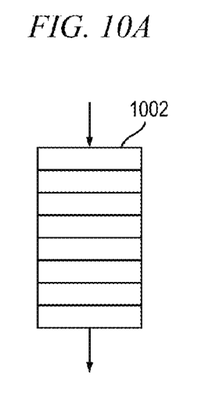
FIGS. 10A-10D depict exemplary hardware support arrangements for reconfiguration and data processing modes of operation, according to embodiments of the invention.
Figure 10B:
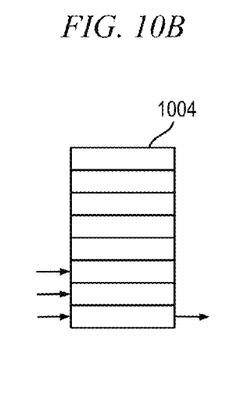

To provide hardware support for both reconfiguration and data processing modes, certain FPGA vendors allow LUT primitives to be operated in two modes; namely, as a shift register and as a memory. With the LUT configured as a shift register, LUT contents are set one bit at a time, in first-in first-out (FIFO) mode. Whenever a new bit is passed to the LUT, all previous contents are shifted. Reading from the LUT results in accessing the oldest available bit in that LUT. FIG. 10A conceptually depicts an exemplary LUT 1002 configured for operation as a shift register. With the LUT configured as a memory, an N-input LUT can store $2^N$ locations, where N is an integer. A location is accessed by setting the correct pointer/address through the N inputs. For instance, "000" points to memory address 0, whereas "100" points to memory address 4 in the LUT. FIG. 10B conceptually depicts an exemplary LUT 1004 configured for operation as a memory.

Figure 10C:
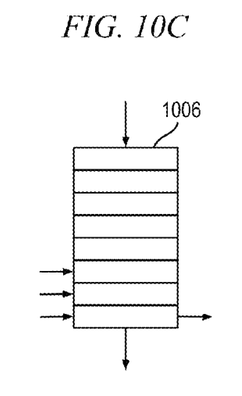

The mechanism according to one or more embodiments of the invention described herein is attained by accessing a LUT both as a shift register and as a memory. FIG. 10C conceptually depicts an exemplary LUT 1006 configured for operation as both a shift register and a memory. In one or more embodiments, during configuration, LUTs are treated as shift registers, such that the output of one LUT can be cascaded to a next LUT. Cascading outputs is not necessary. Furthermore, using the LUT as a shift register is not required in order to modify LUT contents (the LUT can be used as a memory to update its contents), though it does greatly simplify configuration. During normal operation (data processing), the LUT is treated as a memory.

Figure 10D:
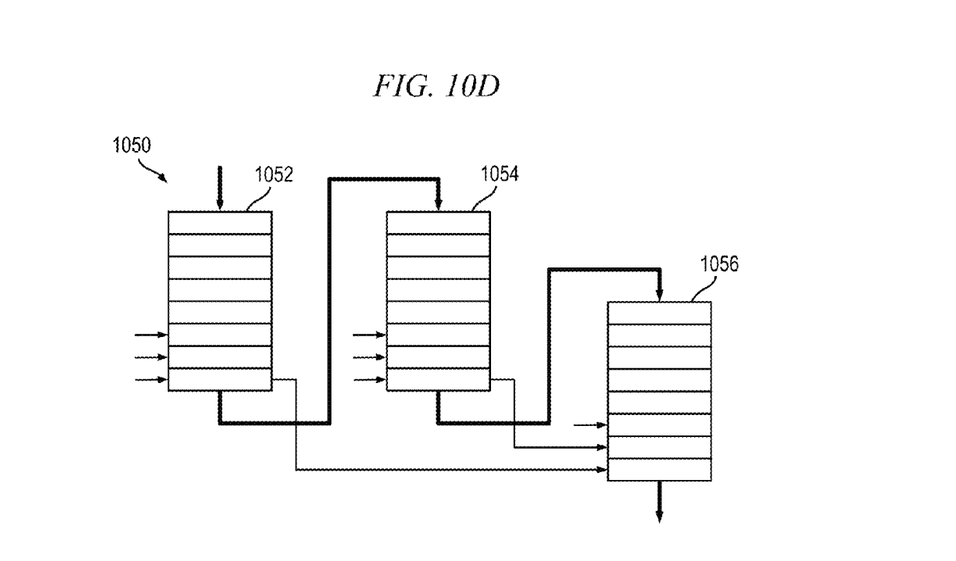

FIG. 10D is a block diagram depicting at least a portion of an exemplary dynamically reconfigurable circuit 1050 for implementing one or more functions, according to an embodiment of the invention. The circuit 1050 comprises a plurality of three-input LUTs, 1052, 1054 and 1056, arranged such that an output of one LUT is connected to an input of a subsequent LUT in a cascaded fashion. Data paths used during configuration, when the LUTs are treated as shift registers, are shown in bold lines compared to data paths used during normal operation (i.e., data processing), when the LUTs are treated as memory. In one or more embodiments, during data processing mode, the configurations are not permitted to be updated; this can be achieved, for example, by clearing a write enable of all the LUTs.

Given the discussion thus far, it will be appreciated that, in general terms, an exemplary method for dynamically reconfiguring logic circuits on an FPGA using native FPGA primitives includes the steps of: classifying a given general function into a set of one or more static functions and a set of one or more modal functions to be implemented on the FPGA; for each of the one or more modal functions, generating a list of one-active actions; devising a circuit topology comprising at least a subset of the plurality of LUTs such that any one of the one or more modal functions can be implemented at a time on the devised circuit topology; for each modal function, associating the devised circuit topology with a controller adapted to load a LUT configuration corresponding to a prescribed one of the one-active actions; implementing a single fixed circuit on the FPGA including devised circuit topologies for each of the modal functions; and updating contents of LUTs corresponding to the LUT configuration in the devised circuit topology when a change in modal function to be implemented on the FPGA is required.

Given the discussion thus far, it will also be appreciated that an exemplary apparatus for dynamically reconfiguring logic circuits on an FPGA using native FPGA primitives without the need for synthesis/place-and-route includes a memory, at least one processor coupled to the memory, and a non-transitory persistent storage medium. The storage medium contains instructions which, when loaded into the memory, configure the processor: to classify a given general function into a set of one or more static functions and a set of one or more modal functions to be implemented on the FPGA; to generate, for each of the one or more modal functions, a list of one-active actions; to devise a circuit topology including at least a subset of the native FPGA primitives such that any one of the one or more modal functions can be implemented at a time on the devised circuit topology; to associate, for each modal function, the devised circuit topology with a controller adapted to load a native FPGA primitive configuration corresponding to a prescribed one of the one-active actions; to implement a single fixed circuit on the FPGA including devised circuit topologies for each of the modal functions; and to update contents of native FPGA primitives corresponding to the native FPGA primitive configuration in the devised circuit topology when a change in modal function to be implemented on the FPGA is required. In one or more embodiments, at least a subset of the native FPGA primitives includes LUTs, the contents of which are modified as a function of the modal function(s) to be implemented.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more non-transitory computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 11:
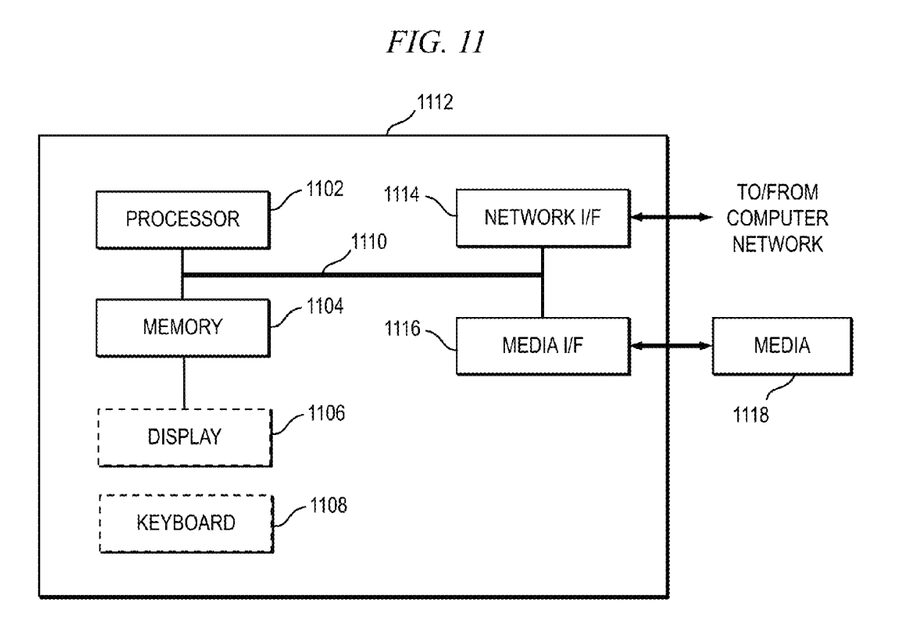
FIG. 11 depicts a computer system that may be useful in implementing one or more aspects and/or elements of the invention.

One or more embodiments can make use of software running on a general purpose computer or workstation which, when configured according to one or more embodiments of the invention, becomes a special-purpose apparatus. With reference to FIG. 11, such an implementation might employ, for example, a processor 1102, a memory 1104, and an input/output interface formed, for example, by a display 1106 and a keyboard 1108. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1102, memory 1104, and input/output interface such as display 1106 and keyboard 1108 can be interconnected, for example, via bus 1110 as part of a data processing unit 1112. Suitable interconnections, for example via bus 1110, can also be provided to a network interface 1114, such as a network card, which can be provided to interface with a computer network, and to a media interface 1116, such as a diskette or CD-ROM drive, which can be provided to interface with media 1118.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1102 coupled directly or indirectly to memory elements 1104 through a system bus 1110. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1108, displays 1106, pointing devices, and the like) can be coupled to the system either directly (such as via bus 1110) or through intervening I/O controllers (omitted for clarity).

Network adapters such as network interface 1114 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1112 as shown in FIG. 11) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1118 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In the context of this document, a computer readable storage medium may be any non-transitory medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each of at least a subset of the blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a non-transitory computer readable storage medium; the modules can include, for example, any or all of the elements depicted in the block diagrams and/or described herein; by way of example and not limitation, an FPGA I/O block or module, an FPGA logic block or module, a LUT, etc. The method steps can then be carried out using the distinct software modules and/or sub-modules of the system, as described above, executing on one or more hardware processors 1102. Further, a computer program product can include a non-transitory computer-readable storage medium with code configured to be implemented to carry out one or more method steps described herein, including the provision of the system with the distinct software modules.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more embodiments of the invention.

An integrated circuit in accordance with aspects of the present disclosure can be employed in essentially any application and/or electronic system where FPGAs are employed. Suitable systems for implementing embodiments of the invention may include, but are not limited to, Extensible Markup Language (XML) querying systems, Structured Query Language (SQL) query predicate evaluation systems, and spatiotemporal querying systems. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method for dynamically reconfiguring logic circuits on a field-programmable gate array (FPGA), the logic circuits comprising a plurality of look-up tables (LUTs), the method comprising the steps of:
    classifying a given general function into a set of one or more static functions and a set of one or more modal functions to be implemented on the FPGA;
    for each of the one or more modal functions, generating a list of one-active actions;

devising a circuit topology comprising at least a subset of the plurality of LUTs such that any one of the one or more modal functions can be implemented at a time on the devised circuit topology;
for each modal function, associating the devised circuit topology with a controller adapted to load a LUT configuration corresponding to a prescribed one of the one-active actions;
implementing a single fixed circuit on the FPGA including devised circuit topologies for each of the modal functions; and
updating contents of LUTs corresponding to the LUT configuration in the devised circuit topology when a change in modal function to be implemented on the FPGA is required.

2. The method of claim 1, wherein implementing said single fixed circuit on the FPGA comprises:
combining a description of static and modal circuit topologies of said given general function into the single fixed circuit;
running the description of static and modal circuit topologies through synthesis, place and route tools to generate an FPGA bitstream; and
downloading the FPGA bitstream onto the FPGA to implement the single fixed circuit on the FPGA.

3. The method of claim 2, wherein the description of static and modal circuit topologies comprises a register-transfer level (RTL) description.

4. The method of claim 1, wherein only a given one of a plurality of possible functions capable of being implemented on the FPGA is used at a time.

5. The method of claim 4, wherein only the given one of said plurality of possible functions capable of being implemented on the FPGA that is in use is resident on the FPGA.

6. The method of claim 1, further comprising:
determining whether one or more modal functions require mode switching;
when mode switching is required, determining whether a new action to be implemented belongs to a set of actions or can otherwise be implemented using available LUTs in a LUT configuration being implemented on the FPGA; and
when the new action to be implemented does not belong to the set of actions or cannot otherwise be implemented using the available LUTs, adding the new action to the set of actions.

7. The method of claim 6, further comprising:
when the new action to be implemented belongs to the set of actions or can otherwise be implemented using the available LUTs, determining whether the new action belongs to the set of actions; and
when the new action belongs to the set of actions, updating, by the controller, LUT contents for implementing the new action using prescribed LUT contents corresponding to the new action.

8. The method of claim 7, further comprising, when the new action does not belong to the set of actions:
devising a new set of LUT contents corresponding to the available LUTs;
augmenting the controller with the new set of LUT contents respective to the new action; and
updating, by the controller, LUT contents for implementing the new action using the new set of LUT contents corresponding to the new action.

9. The method of claim 1, further comprising dynamically switching between reconfiguration and data processing modes of operation, wherein in the reconfiguration mode, each of at least a subset of the LUTs is configured as a shift register, and in the data processing mode, each of at least a subset of the LUTs is configured as a memory.

10. The method of claim 9, further comprising, when in said reconfiguration mode, updating the contents of the LUTs by serially shifting new LUT contents corresponding to a new action to be implemented using the LUT configuration in the devised circuit topology.

11. The method of claim 9, further comprising, when in said reconfiguration mode, updating the contents of the LUTs by writing at least one prescribed LUT location using a corresponding address.

12. The method of claim 9, further comprising, when in said data processing mode, configuring at least a subset of the LUTs to operate as a set of logic functions for processing input data.

13. An apparatus for dynamically reconfiguring logic circuits on a field-programmable gate array (FPGA) using native FPGA primitives without the need for synthesis/place-and-route, the apparatus comprising:
a memory;
at least one processor coupled to said memory; and
a non-transitory persistent storage medium that contains instructions which, when loaded into said memory, configure said at least one processor:
to classify a given general function into a set of one or more static functions and a set of one or more modal functions to be implemented on the FPGA;
to generate, for each of the one or more modal functions, a list of one-active actions;
to devise a circuit topology comprising at least a subset of the native FPGA primitives such that any one of the one or more modal functions can be implemented at a time on the devised circuit topology;
to associate, for each modal function, the devised circuit topology with a controller adapted to load a native FPGA primitive configuration corresponding to a prescribed one of the one-active actions;
to implement a single fixed circuit on the FPGA including devised circuit topologies for each of the modal functions; and
to update contents of native FPGA primitives corresponding to the native FPGA primitive configuration in the devised circuit topology when a change in modal function to be implemented on the FPGA is required.

14. The apparatus of claim 13, wherein each of at least a subset of the native FPGA primitives comprises a look-up table (LUT).

15. The apparatus of claim 13, wherein said instructions, when loaded into said memory, further configure said at least one processor:
to combine a description of static and modal circuit topologies of said given general function into the single fixed circuit;
to run the description of static and modal circuit topologies through synthesis, place and route tools to generate an FPGA bitstream; and
to download the FPGA bitstream onto the FPGA to implement the single fixed circuit on the FPGA.

16. The apparatus of claim 13, wherein said instructions, when loaded into said memory, further configure said at least one processor:
to determine whether one or more modal functions require mode switching;
when mode switching is required, to determine whether a new action to be implemented belongs to a set of actions or can otherwise be implemented using available native FPGA primitives in a native FPGA primitive configuration being implemented on the FPGA; and when the new action to be implemented does not belong to the set of actions or cannot otherwise be implemented using the available native FPGA primitives, to add the new action to the set of actions.

17. The apparatus of claim 13, wherein the at least one processor is configured to dynamically switch between reconfiguration and data processing modes of operation, wherein in the reconfiguration mode, each of at least a subset of the native FPGA primitives is configured as a shift register, and in the data processing mode, each of at least a subset of the native primitives is configured as a memory.

18. The apparatus of claim 17, wherein said instructions, when loaded into said memory, further configure said at least one processor, when in said reconfiguration mode, to update the contents of the native FPGA primitives by serially shifting new contents corresponding to a new action to be implemented using the native FPGA primitive configuration in the devised circuit topology.

19. The apparatus of claim 17, wherein said instructions, when loaded into said memory, further configure said at least one processor, when in said reconfiguration mode, to update the contents of the native FPGA primitives by writing at least one prescribed native FPGA primitive location using a corresponding address.

20. The apparatus of claim 17, wherein said instructions, when loaded into said memory, further configure said at least one processor, when in said data processing mode, to configure at least a subset of the native FPGA primitives to operate as a set of logic functions for processing input data.

* * * * *